United States Patent
Young

(10) Patent No.: US 7,446,051 B2
(45) Date of Patent: Nov. 4, 2008

(54) METHOD OF ETCHING SILICON

(75) Inventor: Trevor Lindsay Young, Botany (AU)

(73) Assignee: CSG Solar AG, Thalheim (DE)

( * ) Notice: Subject to any disclaimer, the term of this patent is extended or adjusted under 35 U.S.C. 154(b) by 115 days.

(21) Appl. No.: 10/569,701

(22) PCT Filed: Sep. 9, 2004

(86) PCT No.: PCT/AU2004/001216

§ 371 (c)(1),
(2), (4) Date: Feb. 24, 2006

(87) PCT Pub. No.: WO2005/024927

PCT Pub. Date: Mar. 17, 2008

(65) Prior Publication Data

US 2006/0292821 A1    Dec. 28, 2006

(30) Foreign Application Priority Data

Sep. 9, 2003    (AU) ............... 2003904934

(51) Int. Cl.
*H01L 21/302* (2006.01)

(52) U.S. Cl. ............. 438/745; 438/748; 438/750; 438/753; 216/91; 216/92

(58) Field of Classification Search ............. 438/745, 438/748, 750, 753; 216/91, 92
See application file for complete search history.

(56) References Cited

U.S. PATENT DOCUMENTS

| | | | |
|---|---|---|---|
| 3,921,916 A | 11/1975 | Bassous | |
| 4,015,986 A * | 4/1977 | Paal et al. | 430/323 |
| 4,174,252 A * | 11/1979 | Kressel et al. | 438/702 |
| 4,517,106 A | 5/1985 | Hopkins et al. | |
| 5,266,125 A | 11/1993 | Rand et al. | |
| 5,459,001 A | 10/1995 | Estes et al. | |
| 6,042,739 A | 3/2000 | Itoh | |

(Continued)

FOREIGN PATENT DOCUMENTS

DE    3047884 A1    7/1982

(Continued)

OTHER PUBLICATIONS

Wikipedia, the free encyclopedia, "Nitric acid", http://en.wikipedia.org/wiki/Nitric_acid ; Sep. 2007.*

*Primary Examiner*—Binh X Tran
(74) *Attorney, Agent, or Firm*—Christensen O'Connor Johnson Kindness PLLC

(57) ABSTRACT

Silicon (12) is etched through a mask (11) comprising a layer of organic resin material (such as novolac) through which openings (32) are formed in the areas to be etched. The layer of organic resin is first deposited over a free surface of the device to be etched. The openings (32) are then formed by depositing droplets of a caustic etchant such as sodium hydroxide (NaOH) or potassium hydroxide (KOH) with an inkjet printer. The etchant reacts with the resin to expose the silicon surface in areas to be etched. The etching of the silicon surface is performed by applying a dilute solution of hydrofluoric acid (HF) and potassium permanganate ($KMnO_4$) to the exposed surface through the openings in the mask to etch the silicon to a desired depth (83).

12 Claims, 8 Drawing Sheets

U.S. PATENT DOCUMENTS

| | | |
|---|---|---|
| 6,245,191 B1 | 6/2001 | Derderian et al. |
| 6,900,548 B2 | 5/2005 | Hashimoto |
| 2003/0029831 A1* | 2/2003 | Kawase ................. 216/27 |
| 2003/0076371 A1 | 4/2003 | Fong |
| 2004/0053800 A1* | 3/2004 | Zhang et al. ............ 510/175 |
| 2004/0081909 A1 | 4/2004 | Ohnishi |
| 2007/0007627 A1 | 1/2007 | Young |

FOREIGN PATENT DOCUMENTS

| | | |
|---|---|---|
| EP | 0930641 A2 | 7/1999 |
| FR | 1602847 A | 3/1971 |
| GB | 1195944 A | 6/1970 |
| GB | 1 457 924 A | 12/1976 |
| GB | 2 367 788 A | 4/2002 |
| JP | 09127675 A | 5/1997 |
| JP | 11-340129 A | 12/1999 |
| JP | 11340129 A | 12/1999 |
| WO | 9921233 A1 | 4/1999 |
| WO | WO 00/72368 A1 | 11/2000 |
| WO | 0147044 A2 | 6/2001 |

* cited by examiner

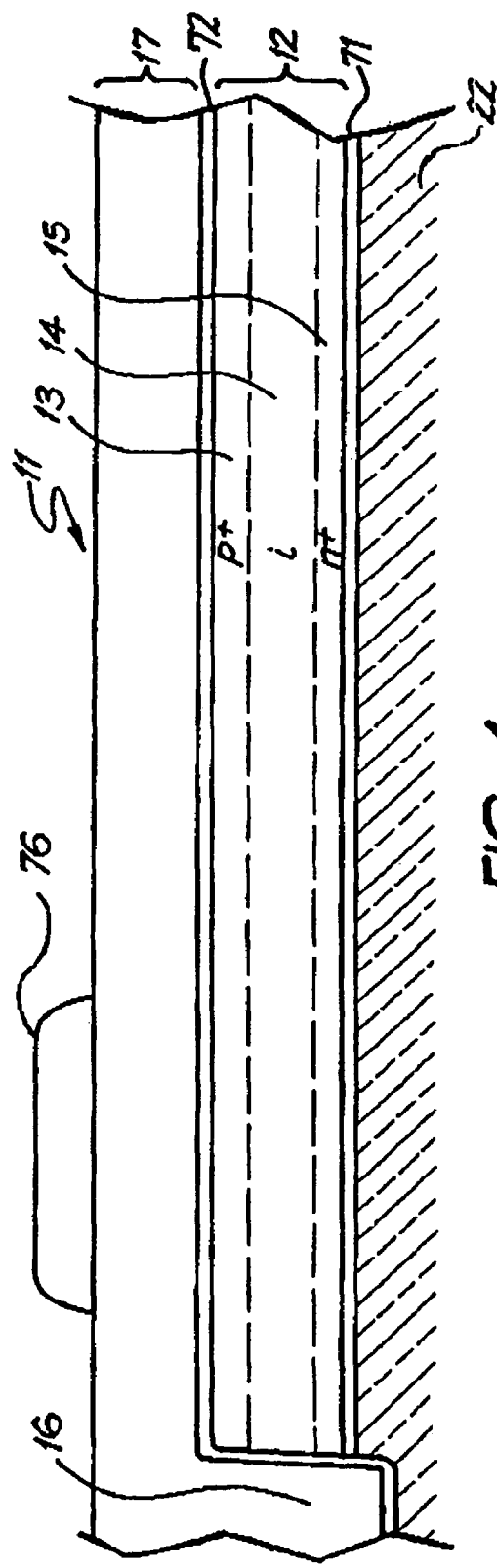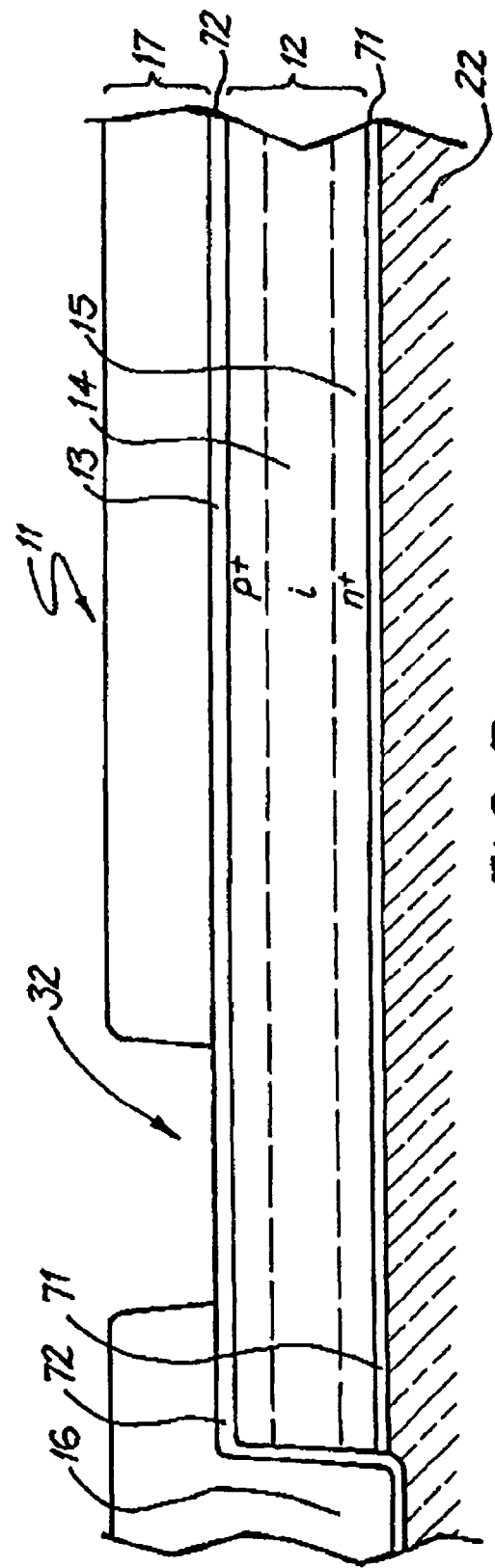

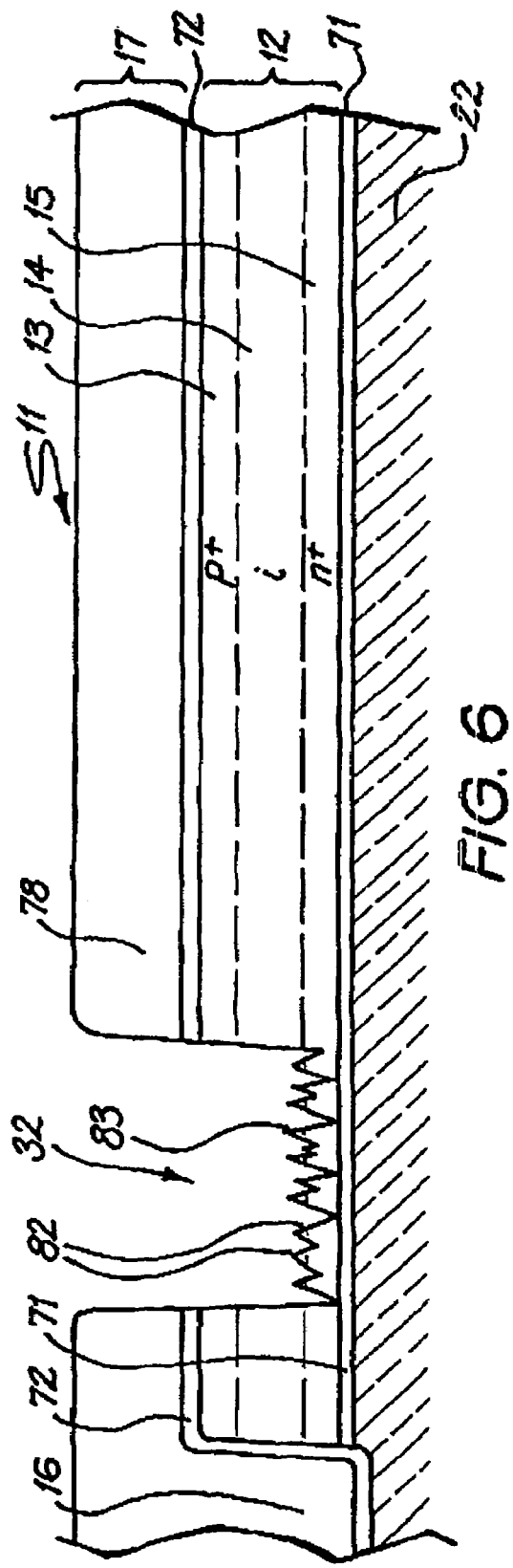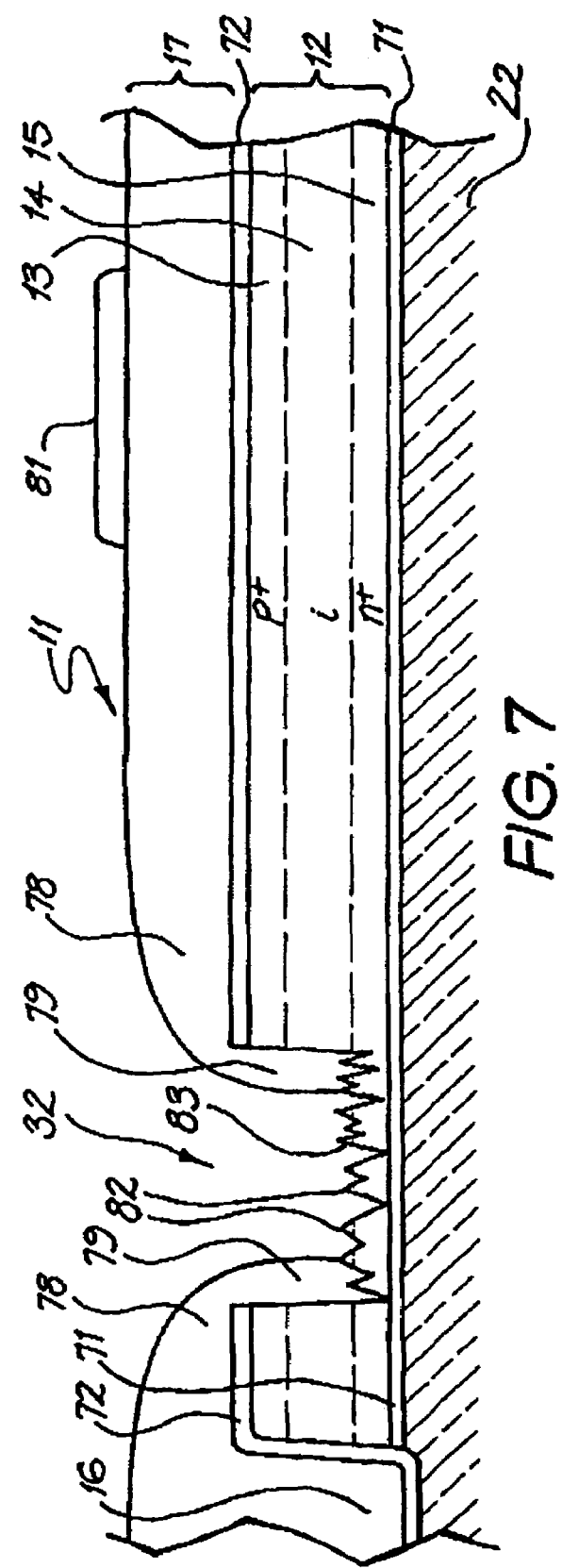

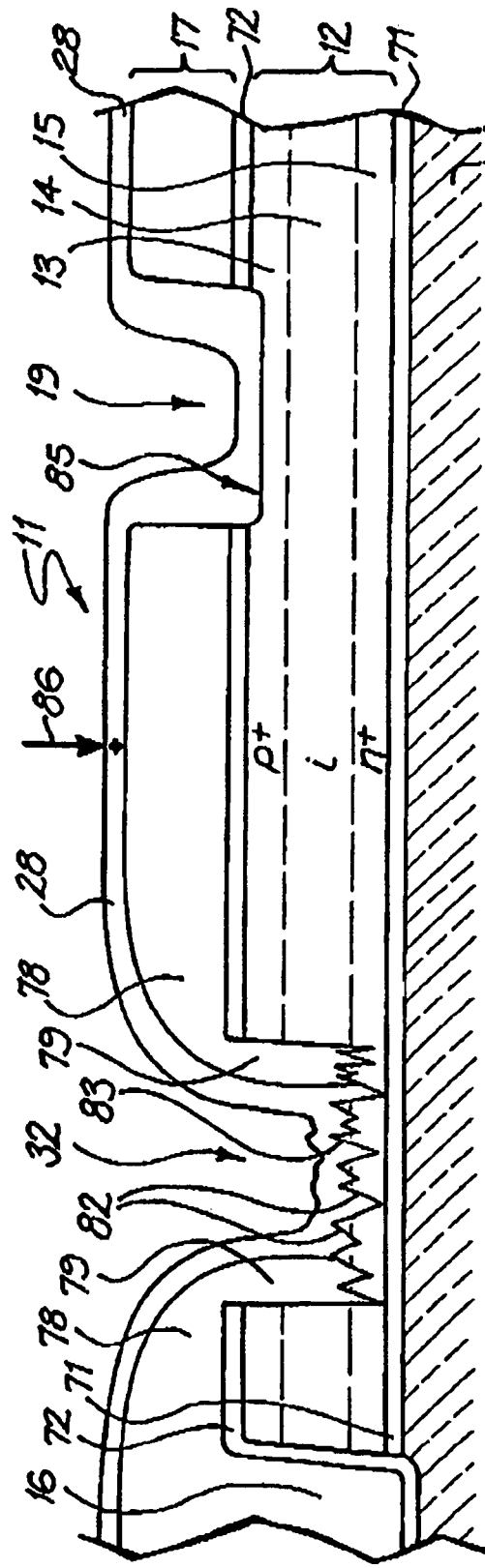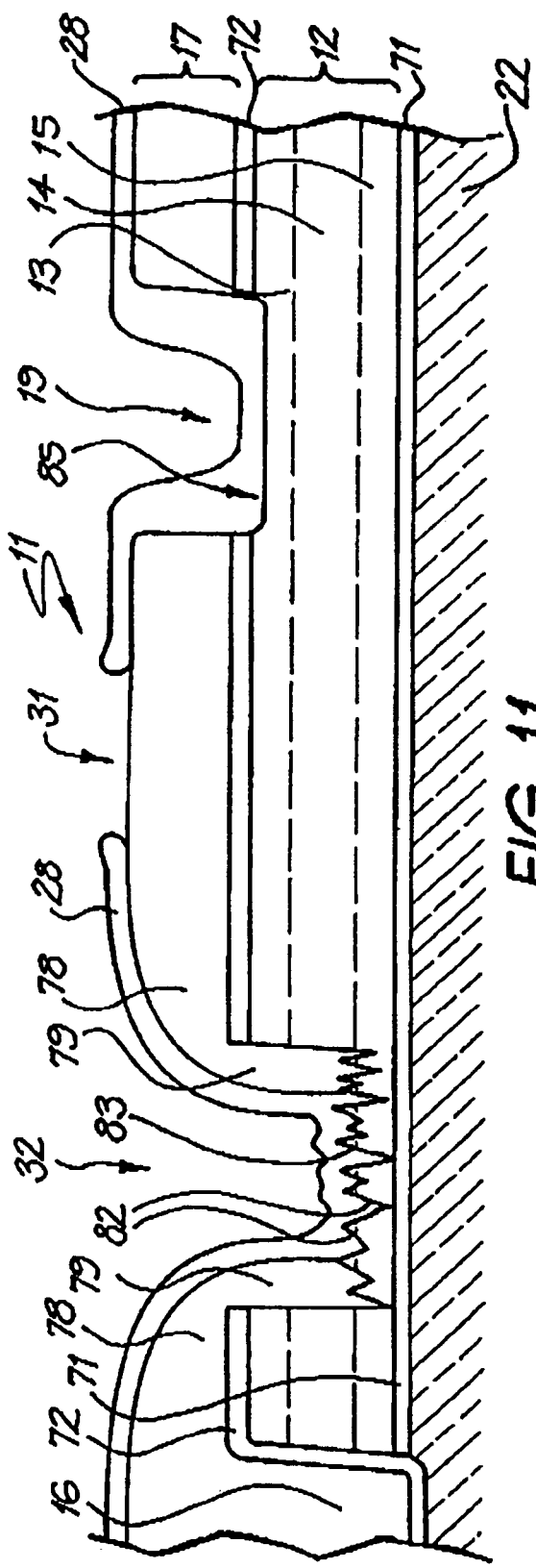

METHOD OF ETCHING SILICON

FIELD OF THE INVENTION

The present invention relates generally to the field of semiconductor device fabrication and in particular the in invention provides an improved processing step for use in a method of forming metal contacts and other structures in thin film semiconductor devices. A new device structure for thin film photovoltaic devices is also provided.

BACKGROUND OF THE INVENTION

A major advantage of thin-film photovoltaic (PV) modules over conventional wafer-based modules is the potential for low cost of production. However in practice cost savings have been difficult to achieve as a major component of cost is the number and complexity of process steps involved in the manufacturing sequence and can quickly outweigh savings in material costs. In particular the number of steps that require precise alignment, or the speed of the equipment used to perform a step can have a strong bearing on cost, as can the robustness of a process, which might in some cases lead to additional remedial steps being required or result in lower performance of the end product because of materiel degradation. Therefore, process improvements which reduce alignment requirement, reduce the number of steps, reduce damage to the device or, allow a step to be performed more quickly provide significant advantages.

SUMMARY OF THE INVENTION

The present invention provides a method of etching silicon through a mask comprising the steps of:
  a) Forming a layer of organic resin as a mask over a free surface of the device to be etched;
  b) Forming openings in the mask to expose the silicon surface in areas to be etched;
  c) Applying a dilute solution of hydrofluoric acid (HF) and potassium permanganate ($KMnO_4$) to the silicon surface exposed through the mask to thereby etch the silicon to a desired depth.

Preferably the area of silicon to be etched has a width and length which are significantly greater (say by at least an order of magnitude) than the depth to be etched. In preferred embodiments the silicon to be etched is a thin film of silicon (such as polycrystalline silicon) on a foreign substrate and the etch is limited by the silicon being etched substantially down to) the substrate. However the process is equally applicable to single crystal material (ie wafer material) and can be made to progress at a rate which allows depth of etch to be controlled by timing of the etch. The depth can be controlled to remove only a thin surface layer (eg to provide a clean surface for further processing) or can remove a significant thickness of the silicon material)

Preferably the dilute solution of HF and $KMnO_4$ comprises a solution of 1% HF and 0.1% $KMnO_4$. With this solution 1.5 μm of silicon will substantially etch away in 12 minutes at room temperature (21° C.).

The organic resin is preferably novolac, but other similar resins are also suitable such as commonly available photoresists. The openings in the resin layer can be formed by chemical removal using solutions of caustic substances such as potassium hydroxide (KOH) or sodium hydroxide (NaOH). In a preferred method according to the invention, droplets of dilute (15%) potassium hydroxide are dispensed at locations intended for etching. The KOH solution is preferably deposited using ink-jet print technology. Other methods of making openings in the mask layer include laser ablation and photographic techniques (using photoresist).

BRIEF DESCRIPTION OF THE DRAWINGS

Embodiments of the invention will now be described by way of example with reference to the accompanying drawings (not drawn to scale) in which:

FIG. 4 is the sectional view seen in FIG. 2 (shifted slightly to the left), after a pattern of etchant has been directly deposited onto the insulating layer to open the insulating layer in areas where contacts to an underlying $n^+$ type region of the semiconductor layer are required;

FIG. 5 is the sectional view seen in FIG. 4 after the insulation layer has been opened in the areas where contacts to the underlying $n^+$ type region of the semiconductor layer are required;

FIG. 6 is the sectional view seen in FIG. 5 after further etching steps have been performed to remove some of the doped semiconductor film in the area where the contact to the underlying $n^+$ type region of the semiconductor layer is required;

FIG. 7 is the sectional view seen in FIG. 6 after a reflow step to flow some of the insulating layer into the hole formed by removal of some of the doped semiconductor film in the area where a contact to the underlying $n^+$ type region of the semiconductor layer are required. A pattern of caustic solution has been directly deposited onto the insulating layer to open the insulating layer in an area where a contact to an upper $p^+$ type region of the semiconductor layer is required;

FIG. 10 is the sectional view seen in FIG. 9 after a metal layer has been applied to contact the $p^+$ and $n^+$ type regions of the semiconductor material and to interconnect adjacent cells;

FIG. 11 is the sectional view seen in FIG. 10 after the metal layer has been interrupted to separate the contacts to the $p^+$ & $n^+$ type regions from each other within each cell;

DETAILED DESCRIPTION OF THE PREFERRED EMBODIMENTS

Figure 1:
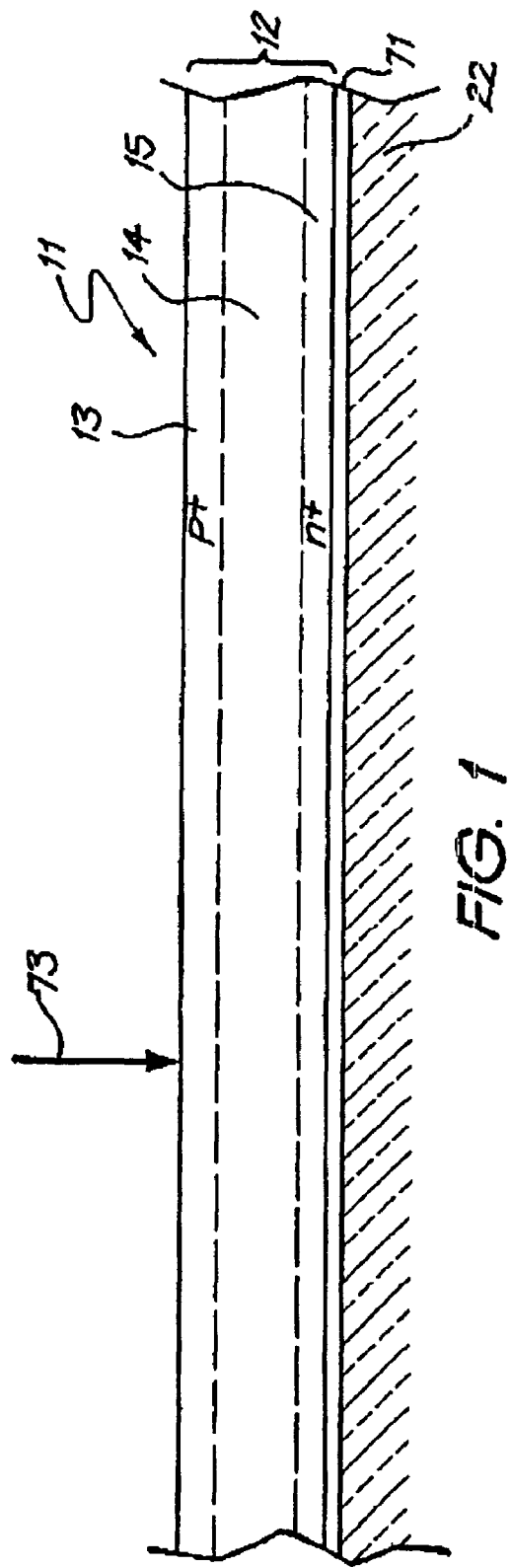
FIG. 1 is a diagram of a section through a semiconductor device after initial steps of applying an anti-reflection coating over a glass substrate and depositing a doped semiconductor film over the anti-reflection coating.

Referring to the drawings, FIG. 1 illustrates a part of a semiconductor structure 11 which is a precursor to the photovoltaic device fabrication process described below. The semiconductor structure 11 is formed as a thin semiconductor film applied to a substrate 22 in the form of a glass sheet to which a thin silicon nitride anti-reflection coating 71 has been applied. The anti-reflection coating 71 has a thickness of 80 nm. For optimal performance, the thin semiconductor film comprises a thin polycrystalline silicon film 12 formed with a total thickness in the range of 1 to 2 µm and preferably 1.6 µm. The polycrystalline silicon film 12 has an upper $p^+$ type region 13 which is 60 nm thick, a lower $n^+$ type region 15 which is 40 nm thick, and a 1.5 µm thick intrinsic or lightly p type doped region 14 separating the $p^+$ and $n^+$ type regions. The sheet resistance in both $n^+$ type and $p^+$ type layers is preferably between 400 and 2500Ω/□, with no more than $2 \times 10^{14}$ $cm^{-2}$ boron in total. Typical values are around 750Ω/□ for $n^+$ type material and 1500Ω/□ for $p^+$ type material. The thickness of the $n^+$ type and $p^+$ type layers is typically between 20 and 100 nm. The glass surface is preferably textured to promote light tapping, but this is not shown in the drawings for sake of clarity.

Division into Cells

Figure 2:
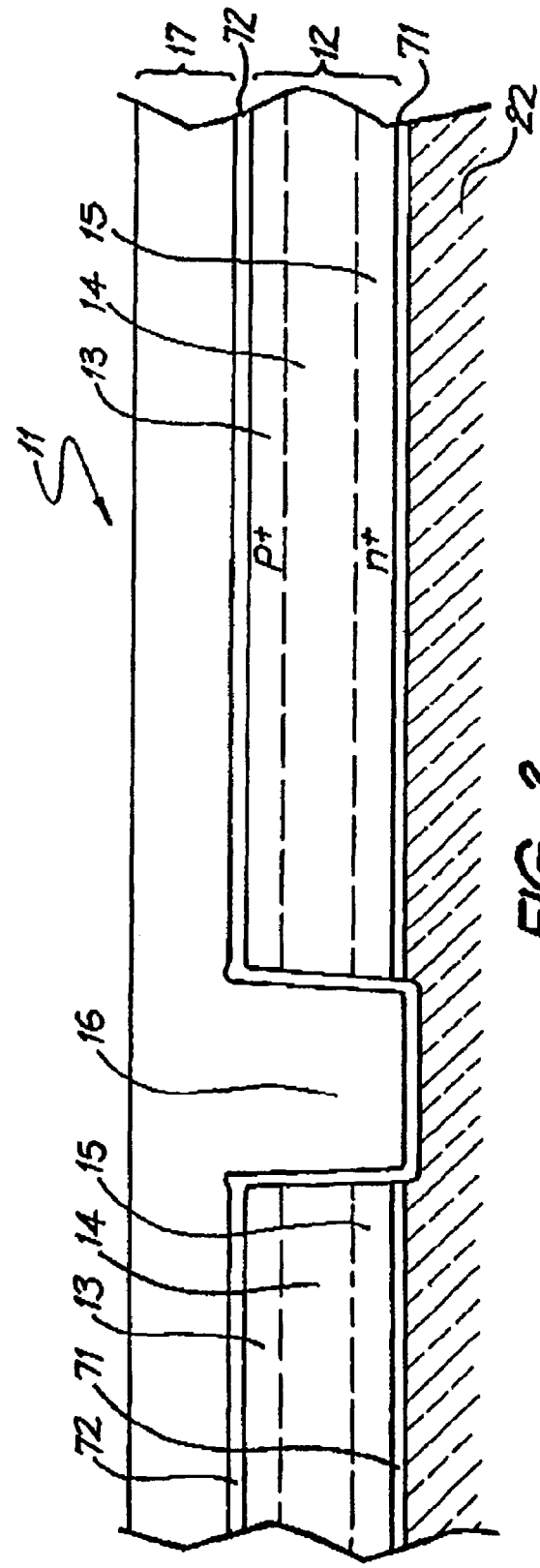
FIG. 2 is the sectional view seen in FIG. 1 after a scribing step has been completed to form a cell separating groove dividing separate cell areas and insulating layers have been applied over the semiconductor layer.

As seen in FIG. 2, the silicon film 12 is separated into cells by scribed isolation grooves 16. This is achieved by canning a laser over the substrate in areas where isolation grooves 16 are required to define the boundaries of each photovoltaic cell. To scribe the grooves 16, the structure 11 is transferred to an X-Y stage (not shown) located under a laser operating at 1064 nm to produce focussed laser beam 73 which cuts the isolation grooves through the silicon. The laser beam is focussed to minimise the width of the groove, which is lost active area. Typically, a pulse energy of 0.11 mJ is required to fully ablate the silicon film and gives a groove width of 50 µm. To ensure a continuous groove, successive pulses are overlapped by 50%. The optimum cell width is in the range of 5 to 8 mm and cell widths of 6 mm are typical.

As seen in FIG. 2, two layers of insulation are preferably used on the surface of the silicon and are added after the laser scribing step described above. The first insulation layer is an optional thin but tough cap nitride 72. This layer protects the exposed silicon along the edges of the cell definition grooves 16 after laser scribing and passivates the surface of the silicon. The cap nitride 72 is preferably capable of being etched completely in a few minutes to allow access to the silicon at n type and p type contact locations and typically comprises 60 nm of silicon nitride deposited by PECVD at a temperature of 300-320° C.

Before the cap layer 72 is applied, the structure 11 is transferred to a tank containing a 5% solution of hydrofluoric acid for one minute. This removes any remaining debris and any surface oxides that may have formed. The structure is rinsed in de-ionised water and dried.

The second insulation layer 17 is a thin layer of organic resin. The insulating resin is resistant to dilute solutions of hydrofluoric acid (HF) and potassium permanganate ($KMnO_4$), and is preferably vacuum compatible to $10^{-6}$ mbar. The insulation material most often used is novolac resin (AZ P150) similar to that used in photoresist (but without any photoactive compounds). The novolac resin is preferably loaded with 20-30% white titania pigment (titanium dioxide) which improves coverage and gives it a white colour that improves its optical reflectivity to help trap light within the silicon. The resin layer 17 serves as an etch mask for etching steps described below and also covers over the rough jagged surface that is formed along the edges of the cell definition grooves 16, an area that is prone to pinholes in the cap nitride layer 72. The organic resin layer 17 also thermally and optically isolates the metal layer from the silicon to facilitate laser patterning of a metal layer in contact forming process steps described below.

The novolac resin is applied to each module to a thickness of 4 to 5 µm using a spray coater. After the structure 11 is coated, it is passed under heat lamps to heat it to 90° C. to cure. As seen in FIG. 2, the insulation layer 17 is applied over the cap layer 72 and extends into the cell separation grooves 16.

Opening Mask and Etching n Type Contact Openings

Figure 3:
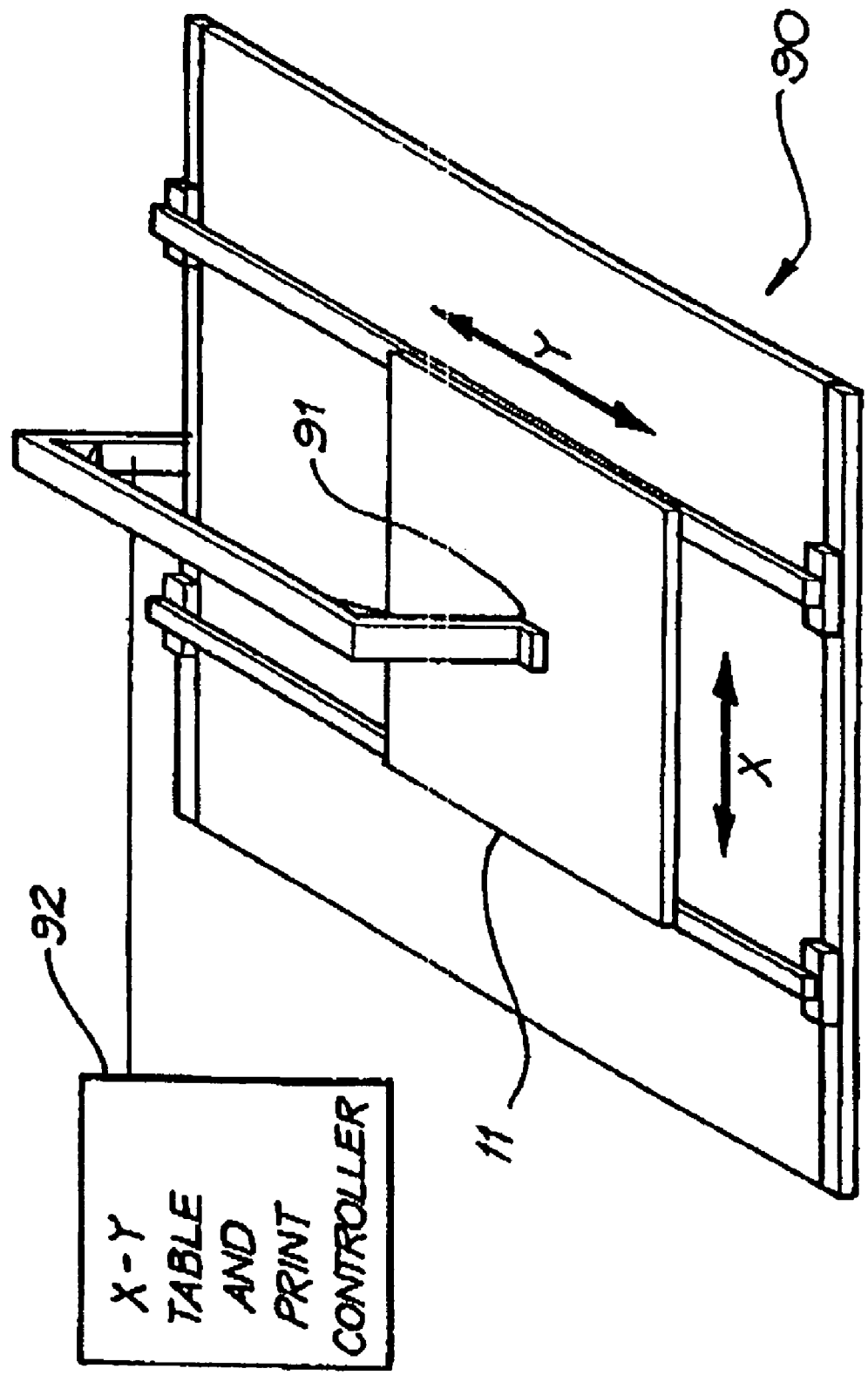
FIG. 3 is a schematic diagram of an X-Y table with an inkjet print head fitted for directly applying the insulation etchant, using inkjet technology.

In order to make electrical contact to the buried $n^+$ type layer and the upper $p^+$ type layer with a metal layer which will be subsequently formed, holes must be made through the novolac resin layer 17 and the cap nitride layer 72 in the locations where the n type "crater" contacts and the p type "dimple" contacts are required. Firstly with regard to the "crater" contacts to the buried $n^+$ type silicon layer, as well opening the novolac resin layer 17 and the cap nitride layer 72, most of the silicon film 12 must be removed from areas beneath what will later become the n type metal pads to form the n type contact openings 32. Referring to FIGS. 3, 4 and 5 ink-jet technology is used to open holes in the novolac resin layer 17 at the crater locations. To achieve this the structure 11 is loaded onto an X-Y stage equipped with an ink-jet head 91 having multiple nozzles with a nozzle spacing of 0.5 mm and controlled by controller 92. The glass is held down with a vacuum chuck and initially scanned to ensure that no point is deformed more than 1 mm above the stage. The glass is then scanned beneath the head 91 at a table speed of typically 400 mm/s. Droplets 76 of dilute (15%) potassium hydroxide (KOH) (see FIG. 4) are dispensed at locations intended for n type 'crater' contacts. The odd-numbered nozzles fire in the odd-numbered cells, and the even-numbered nozzles fire in the even-numbered cells, so that within a given cell, the spacing between lines of droplets is 1 mm. The spacing between droplets within each line is 400 µm, hence the rate of droplet release at a table speed of 400 mm/s is 1 kHz. The droplets are sized to etch circular openings in the resin layer that are about 100 µm in diameter. The KOH solution removes the resin insulation 17 in the area of the droplet 76 after a few minutes to form the hole 32 seen in FIG. 5.

The openings 32 are spaced holes so that lateral continuity is maintained in the semiconductor layer after contact formation. The ink-jet printing process applies a droplet 76 of the caustic solution in a controlled manner to remove the insulation only where the n type contacts are to be formed. The caustic solution preferably contains potassium hydroxide (KOH) but can also use sodium hydroxide (NaOH) and includes glycerol for viscosity control. The print head used for this purpose is a model 128ID, 64ID2 or 64-30 manufactured by Ink Jet Technologies Inc., and will print substances having a viscosity in the range 5 to 20 centipoise. The droplet size deposited by the print head is in the range of 20 to 240 picolitre corresponding to a deposited droplet diameter range of 50-150 µm. In the preferred embodiment the droplets are printed at a diameter of 100 µm. It should be noted that novolac is an organic resin closely related to the resins used in photo-resist material and the etchant printing process described above will apply equally to the patterning of other such materials.

To extend the opening 32 into the silicon layer 12 as seen in FIG. 6, the structure 11 is rinsed in water to remove residual KOH from the ink-jet printing process, and it is then immersed in a tank containing a 5% solution of hydrofluoric acid for 1 minute to remove the silicon nitride from the n type contact openings 32. The sheet is then directly transferred toga tank containing 1% hydrofluoric acid (HF) and 0.1% potassium permanganate ($KMnO_4$) for 4 minutes. This time is long enough to remove all of the $p^+$ type layer and etch down along grain boundaries to expose some of the $n^+$ type layer for the silicon thicknesses stated above however the time should be adjusted for different silicon layer thicknesses, silicon crystal quality and extent of surface texturing. The structure 11 is then rinsed in de-ionised water and dried.

The resulting opening 32 in the silicon 12 has a rough bottom surface 82, in which some points may be etched through to the anti-reflection layer 71 and some ridges 83 extend into the lightly doped p type region 14 as seen in FIG. 6. However as long as some of the $n^+$ type region is exposed, good contact can be made to the $n^+$ type region. Because the p type region is very lightly doped in the area near the $n^+$ type region there is insufficient lateral conductivity to cause shorting if some p type material is also left in the bottom of the hole 32.

Reflow of Mask

Because the side walls of the hole 32 are passing trough the $p^+$ type region 13 and the lightly doped region 14, the walls need to be insulated to prevent shorting of the p-n junction. This is achieved by causing the insulation layer 17 to re-flow whereby a portion of the insulation layer 78 in the vicinity of the edge of the opening 32 flows into the hole to form a covering 79 over the walls as seen in FIG. 7. To achieve this the sheet is passed through a zone containing a vapour of a suitable solvent. This causes the novolac resin of the insulating layer 17 to reflow, shrinking the size of the crater openings. 32. As the samples exit this zone, they are heated under heat lamps to a temperature of 90° C. to drive out the remaining solvent.

The rate of re-flow will vary with the aggressiveness of the solvent used, the concentration and, temperature. There are many suitable, volatile solvents that will dissolve organic resins such as novolac, including substances such as acetone. Acetone is a suitable solvent for the process, but acts quite aggressively, requiring only a few seconds to cover the walls of the hole 32 with resin, and making it difficult to control the pus accurately. The preferred solvent is propylene glycol monomethyl ether acetate (PGMEA) and the device is introduced into an atmosphere containing a saturated vapour of PGMEA at room temperature (eg, 21° C.) for 4 minutes until a slight shrinkage of the holes in the insulation is observed.

Opening Mask and Cleaning p Type Contact Openings

Figure 8:
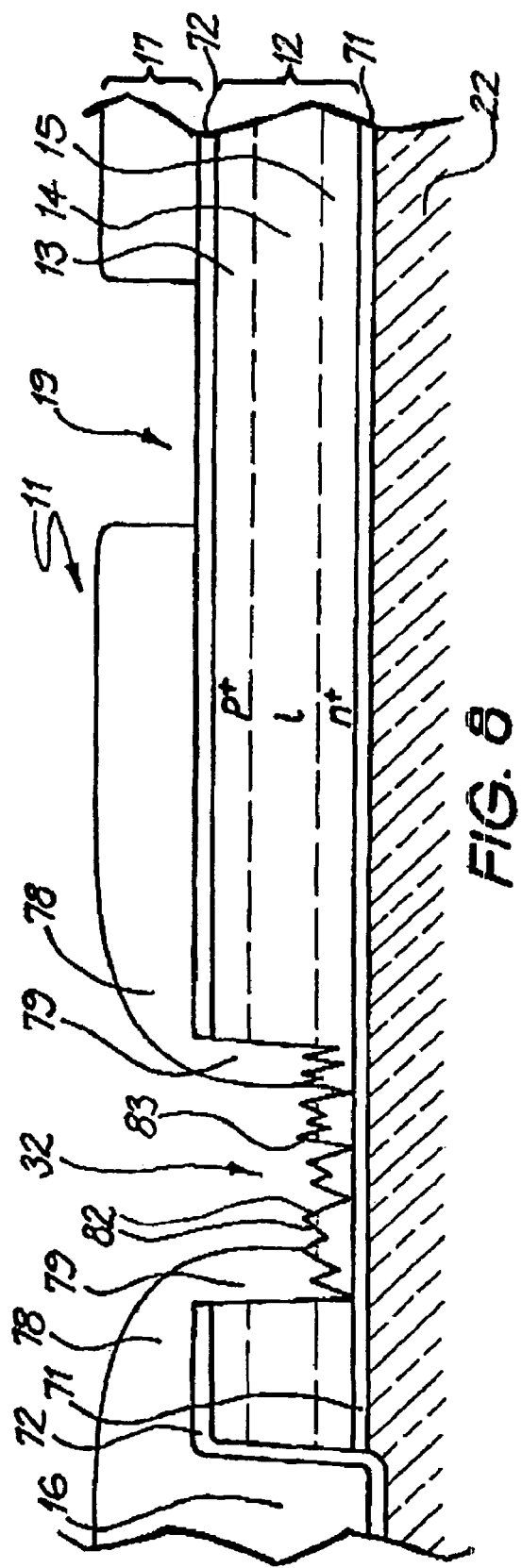
FIG. 8 is the sectional view seen in FIG. 7 after the caustic has opened the insulation layer in the areas where the contact to the upper $p^+$ type region of the semiconductor layer is required.
Figure 9:
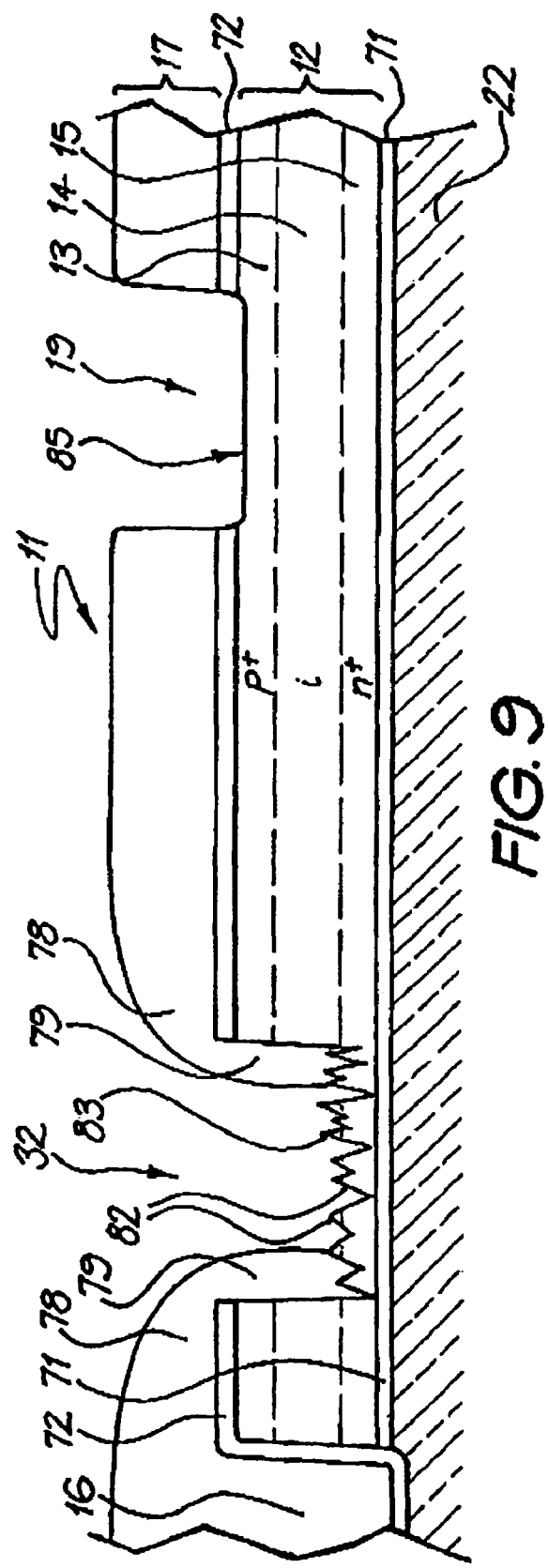
FIG. 9 is the sectional view seen in FIG. 8 after further etching steps have been performed to clean the surface of the doped semiconductor film of damaged material in the areas where the contact to the upper $p^+$ type region of the semiconductor layer is required.

A further set of holes 19 (see FIG. 8) are then formed in the insulation layer 17, again using the printing and etching process described above with reference to FIGS. 3, 4 and 5. These-openings are formed by printing droplets 81 of caustic solution onto the insulation (see FIG. 7) in the locations where p type contact "dimples" are required. Following the removal of the insulation layer 17 by the caustic solution to form the openings 19 (see FIG. 8), any residual caustic solution is washed off with water and the cap layer 72 removed in the openings 19 with an etch of 5% hydrofluoric acid (HP) for 1 minute (note times of from 10 seconds to 10 minutes may be required to remove the nitride layer depending on its stoichiometry). Optionally, any damaged silicon material on the surface of the $p^+$ type region 13 is then removed to allow good contact using an etch in 1% hydrofluoric acid (HF) and 0.1% potassium permanganate ($KMnO_4$) for ten seconds followed by a rinse in de-ionised water to provide the slightly recessed contact "dimple" 85 seen in FIG. 9. This length of etch is long enough to remove surface plasma damage without etching all the way through the $p^+$ type layer 13. It is also short enough to have negligible impact on the n type contacts.

Formation of Metal Contacts

The final stage of device fabrication involves depositing a metal layer and slicing it up so that it forms a plurality of independent electrical connections, each one collecting current from one line of p type dimple contacts and delivering it to a line of n type crater contacts in the adjacent cell. In this manner, monolithic series interconnection of the cells is achieved.

Before the metal layer is applied, the structure 11 is immersed into a tank containing a 0.2% solution of hydrofluoric acid for 20 seconds. This acid removes the surface oxide from both the crater and dimple contacts. There is wide latitude for the strength and duration of this etch. The structure is then rinsed in deionised water and dried.

Turning to FIG. 10, the contact metal for the n type and p type contacts is applied simultaneously by depositing a thin metal layer 28 over the insulation layer 17 and extending into the holes 32 and 19 to contact the surfaces 82 and 85 of the $n^+$ type region 15 and $p^+$ type region 13. The metal layer is preferably a thin layer of pure aluminium, which makes good electrical contact to both $n^+$ type and $p^+$ type silicon, provides good lateral conductivity, and has high optical reflectance. The aluminium thickness is typically 100 nm.

Isolation of n an p Type Contacts

The isolation of the n type end p type contacts is achieved by using a laser 86 (see FIG. 10) to melt and/or evaporate the metal layer 28 to thereby form an isolation groove 31 as seen in FIG. 11. When the laser is pulsed on, a small amount of metal is ablated directly under the beam creating a hole 31.

The structure 11 is processed using a laser operating at 1064 nm to scribe the isolation grooves in the metal layer 28. The laser is adjusted so that it scribes through the metal layer 28 without damaging the silicon 12. These scribes 31 separate the n type contacts 32 from the p type contacts 19 within each cell, while retaining the series connection of each cell to its neighbours. Preferred laser conditions are a pulse energy of 0.12 mJ with the beam defocused to a diameter of about 100 μm. The pulse overlap is 50% and the scribes are spaced 0.5 mm apart. In addition, there are discontinuous scribes 34 along each cell definition groove 16 (see FIG. 12).

Figure 12:
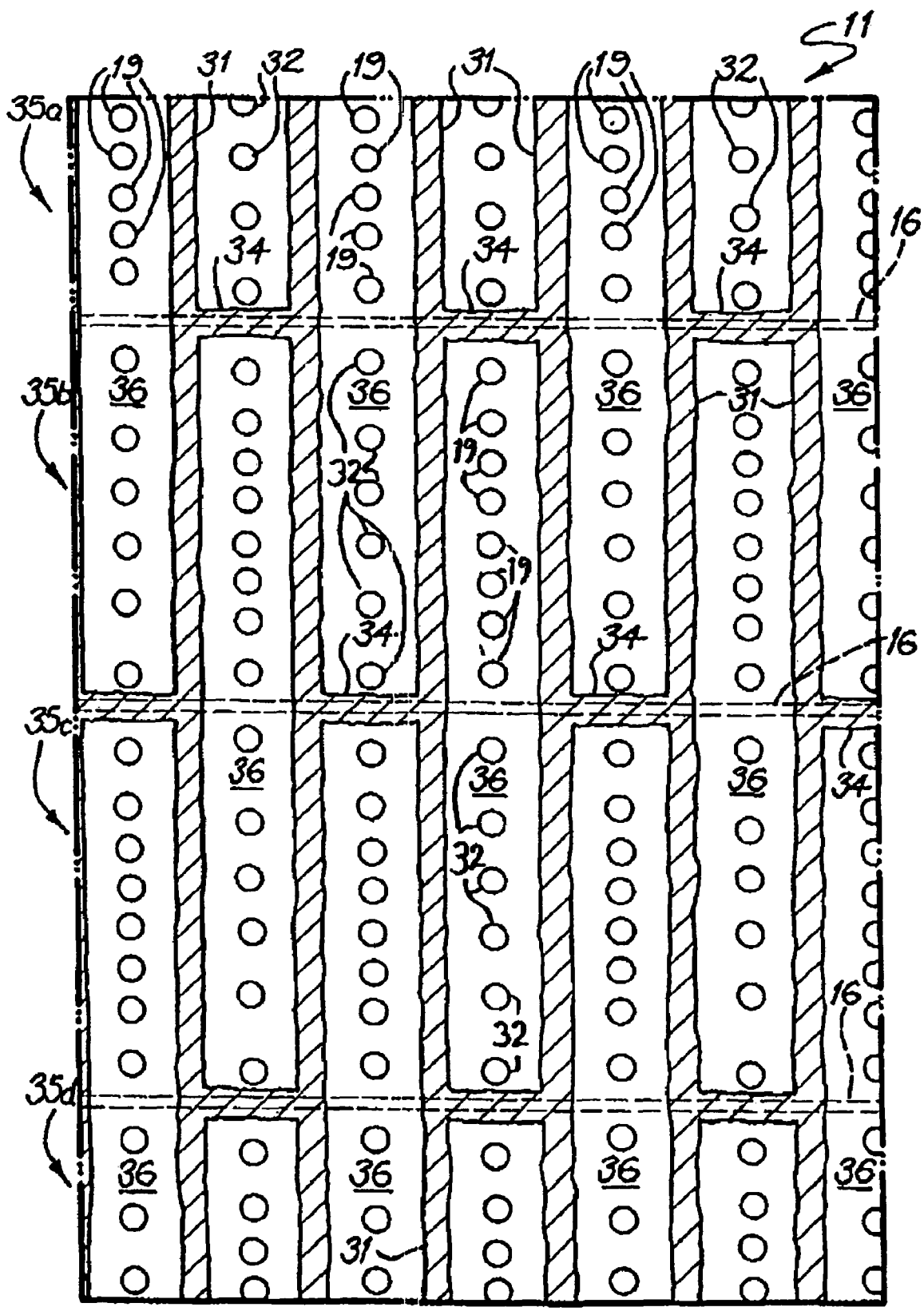
FIG. 12 is a back view (silicon side) of part of the device of FIG. 11.

FIG. 12 illustrates a rear view of a part of a device made by the process described above, from which it can be seen that each of the cells of the device 11 comprises an elongate photovoltaic element 35a, 35b, 35c, 35d divided across its long axis by a plurality of transverse metal isolation scribes 31 which isolate alternate sets of holes 19 and holes 32 respectively providing contacts to the $p^+$ type and $n^+$ type regions of the cell. The transverse scribes 31 are made as long substantially straight scribes extending over the length of the device such that each scribe crosses each elongate cell.

Following the formation of the first set of scribes 31, a fewer set of metal isolation scribes 34 are formed over the cell separation scribes 16 between adjacent cells 11, to isolate every second pair of cells. The metal isolation scribes 34 extending to either side of any one of the elongate transverse scribes 31 are offset by one cell with respect to those on the other side of the same transverse scribe 31 such that the cells become series connected by a matrix of connection links 36 with alternating offsets, connecting one set of p type contacts 19 of one cell 35 to a set of n type contacts 32 of an adjacent cell 35, as shown in FIG. 12.

The metal isolation scribes 31 comprises a first set of long scribes transverse to the cells 35 from 50-200 μm wide, preferably about 100 μm wide. The scribes are typically spaced on centres of 0.2-2.0 mm and preferably about 0.5 mm to form conducting strips about 0.2-1.9 mm and preferably about 0.4 mm wide. The isolation scribes 34 comprises a second set of interrupted scribes parallel to the long direction of the cells 35 and substantially coincident with the cell isolation grooves 16 in the silicon, The isolation scribes 34 are also from 50-200 μm wide, preferably about 100 μm wide. It is equally possible to form the isolation scribes 34 before forming the transverse isolation scribes 31. The scribed areas are illustrated in FIG. 12 with cross-hatching.

Figure 13:
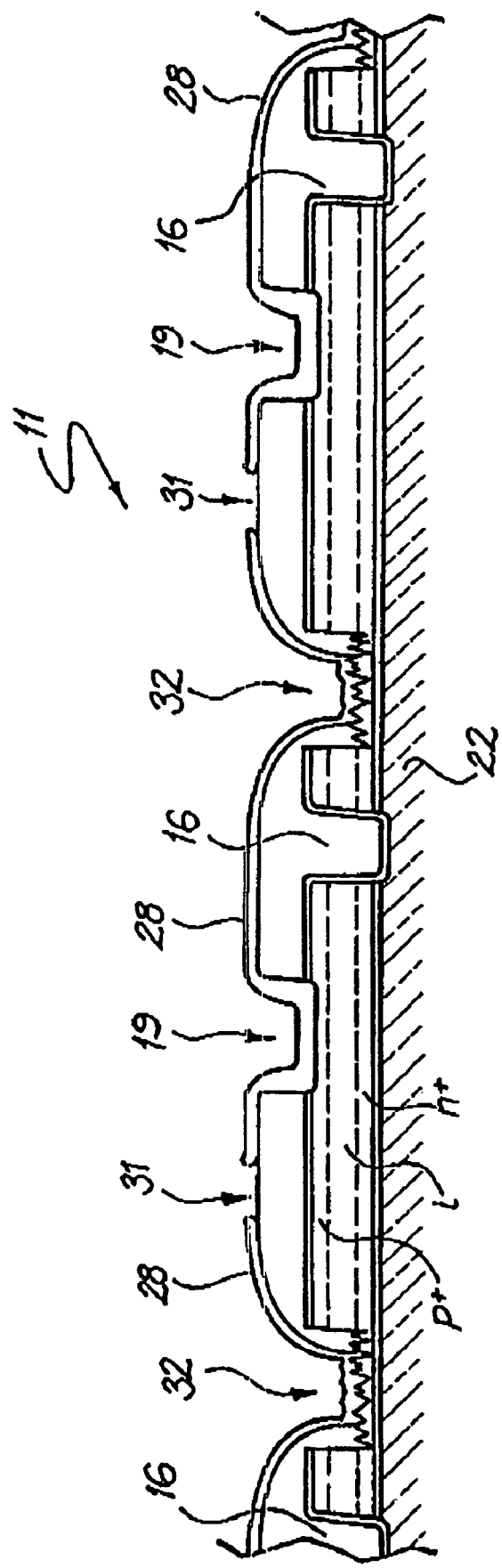
FIG. 13 is a diagram of a part of a completed device, illustrating the interconnection between adjacent cells.

A portion of the completed-structure is illustrated in FIG. 13 which shows the connection of an n type contact of one cell to the p type contact of an adjacent cell to provide a series connections of cells. In practice there may be several n type contacts grouped together and several p type contacts grouped together however for the sake of clarity only one of each is shown in each cell. The arrangement shown in FIG. 13 is also schematic as the isolation grooves 16 in the silicon and the isolation grooves 31 in the metal run perpendicularly to one mother in practice as is seen in FIG. 12.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of etching silicon through a mask comprising:
   (a) forming a layer of organic resin as a mask over a free surface of a device to be etched;
   (b) placing the device on a stage;
   (c) locating an ink-jet print device over the device to be etched and in close proximity thereto, the ink-jet device and stage being moveable relative to one another;
   (d) using an additive to adjust the viscosity of a reactive material to that required by the ink-jet device;
   (e) supplying the ink-jet device with the reactive material with the additive added;
   (f) moving the device and the ink-jet device relative to one another under control of control means;
   (g) controlling the ink-jet device to deposit predetermined amounts of the reactive material onto a surface of the mask in a predetermined pattern as the device and the ink-jet device move relative to one another, to form openings in the mask, thereby exposing the silicon surface in areas to be etched; and
   (h) applying a dilute solution of hydrofluoric acid (HF) and potassium permnanganate ($KMnO_4$) to the silicon surface exposed through the mask to thereby etch the silicon to a desired depth.

2. The method of claim 1, wherein the material to be etched is a thin film of silicon on a foreign substrate.

3. The method of claim 1, wherein the area of silicon to be etched has a width and length which are at least an order of magnitude greater than the depth to be etched.

4. The method of claim 1, wherein the silicon to be etched is crystalline silicon.

5. The method as claimed in claim 1, wherein the organic resin material is novolac.

6. The method of claim 1, wherein the stage is an X-Y stage and the ink-jet device is fixed, such that relative motion of the device to be etched and the ink-jet device is achieved by moving the stage under the ink-jet device.

7. The method as claimed in claim 1, wherein the openings in the mask are formed using a solution of potassium hydroxide (KOH) or sodium hydroxide (NaOH).

8. The method of claim 1, wherein the viscosity of the reactive material is adjusted to be in the range of 5 to 20 centipoise.

9. The method of claim 8, wherein the viscosity adjusting additive is glycerol.

10. The method claim 1, wherein the etch is performed until at least a portion of a substrate is exposed in each area to be etched.

11. The method of claim 10, wherein the etch substantially completely removes the silicon from the substrate in each area to be etched.

12. The method of claim 10, wherein the silicon to be etched is a thin film of polycrystalline silicon on a foreign substrate.

* * * * *

UNITED STATES PATENT AND TRADEMARK OFFICE
CERTIFICATE OF CORRECTION

PATENT NO. : 7,446,051 B2  Page 1 of 1
APPLICATION NO. : 10/569701
DATED : November 4, 2008
INVENTOR(S) : T. L. Young It is certified that error appears in the above-identified patent and that said Letters Patent is hereby corrected as shown below:

| COLUMN | LINE | ERROR |
|---|---|---|
| 8 | 10 | "permnanganate" should read |
| (Claim 1, | line 21) | --permanganate-- |

Signed and Sealed this

Twenty-sixth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,446,051 B2  Page 1 of 1
APPLICATION NO. : 10/569701
DATED : November 4, 2008
INVENTOR(S) : T. L. Young It is certified that error appears in the above-identified patent and that said Letters Patent is hereby corrected as shown below:

| COLUMN | LINE | ERROR |
|---|---|---|
| On the Title page Item (87) | PCT Pub. Date | "Mar. 17, 2008" should read --Mar. 17, 2005-- |

Signed and Sealed this

Thirtieth Day of June, 2009

JOHN DOLL
*Acting Director of the United States Patent and Trademark Office*